US005501608A

United States Patent [19]
Scheer et al.

[11] Patent Number: 5,501,608
[45] Date of Patent: Mar. 26, 1996

[54] COMPUTER SYSTEM WITH AN INTERCONNECTION RECEPTACLE SUITABLE FOR DIFFERENT EXTERNAL CONNECTORS

[75] Inventors: David C. Scheer, Pollock Pines; Homer T. Gee, Roseville, both of Calif.

[73] Assignee: Intel Corporation, Santa Clara, Calif.

[21] Appl. No.: 170,098

[22] Filed: Dec. 20, 1993

[51] Int. Cl.⁶ .................................................. H01R 27/00
[52] U.S. Cl. .......................... 439/218; 439/676; 439/76.1
[58] Field of Search ............................... 439/218, 76, 64, 439/676, 638, 639

[56] References Cited

U.S. PATENT DOCUMENTS

| | | |
|---|---|---|
| Re. 34,369 | 9/1993 | Darden et al. . |
| 4,530,069 | 7/1985 | Desrochers . |
| 4,695,925 | 9/1987 | Kodai et al. . |
| 4,811,165 | 3/1989 | Currier et al. . |
| 4,951,280 | 8/1990 | McCool et al. . |
| 5,139,439 | 8/1992 | Shie ..................................... 439/638 X |
| 5,183,404 | 2/1993 | Aldous et al. . |
| 5,184,282 | 2/1993 | Kaneda et al. . |
| 5,187,645 | 2/1993 | Spalding ............................. 439/218 X |
| 5,207,586 | 5/1993 | MacGregor et al. . |
| 5,272,477 | 12/1993 | Tashima et al. . |
| 5,285,057 | 2/1994 | Murohara . |
| 5,296,692 | 3/1994 | Shino . |
| 5,296,850 | 3/1994 | King . |
| 5,303,121 | 4/1994 | Thornberg . |
| 5,313,364 | 5/1994 | Omori et al. . |

OTHER PUBLICATIONS

No Author, *PCMCIA, Personal Computer Memory Card International Association PC Card Standard, Release 2.0*, 3–13 through 3–26 (Sep. 1991).

No Author, *PCMCIA, Recommended Extensions, Release 1.00*, 1–3 through 1–8 (1992).

*Primary Examiner*—David L. Pirlot
*Assistant Examiner*—Barry M. L. Standig
*Attorney, Agent, or Firm*—Blakely, Sokoloff, Taylor, & Zafman

[57] ABSTRACT

An interconnecting receptacle for a computer system is described. The interconnecting receptacle includes a case mounted on a housing of the computer system for receiving an external connector and a plurality of metallic contacts located inside the case for electrically connecting circuitry of the computer system inside the housing to the external connector. The external connector can be one of (1) a first type of connector that includes a first number of electrical connectors and (2) a second type of connector that includes a second number of electrical connectors. When the external connector is the first type of connector and is inserted inside the case, a first set of the plurality of metallic contacts are used to connect to the first number of electrical connectors of the external connector. When the external connector is the second type of connector and is inserted inside the case, a second set of the plurality of metallic contacts are used to connect to the second number of electrical connectors of the external connector such that the interconnecting receptacle can be connected to both the first and second types of connectors. A computer system that includes an integrated circuit card and an interconnecting receptacle is also described. The interconnecting receptacle electrically connects the integrated circuit card to an external connector such that when the integrated circuit card is changed, the interconnecting receptacle does not need to be changed.

16 Claims, 5 Drawing Sheets

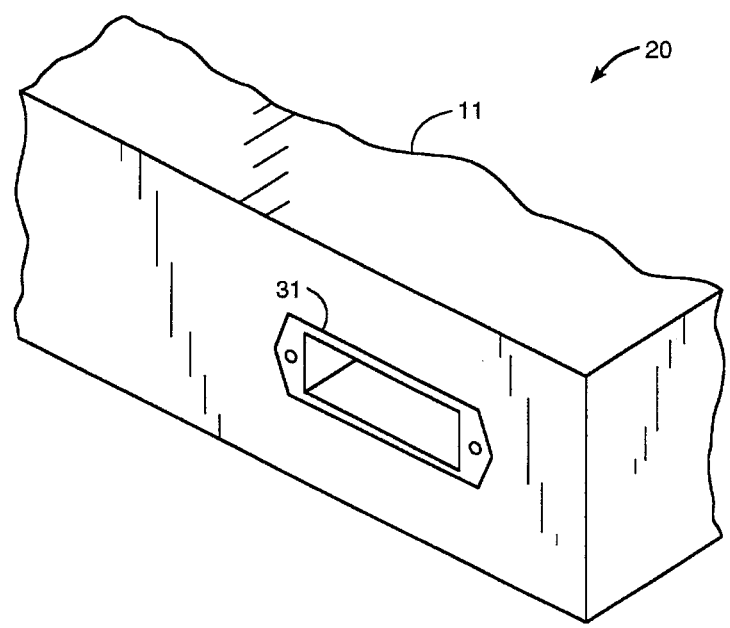
FIG_1
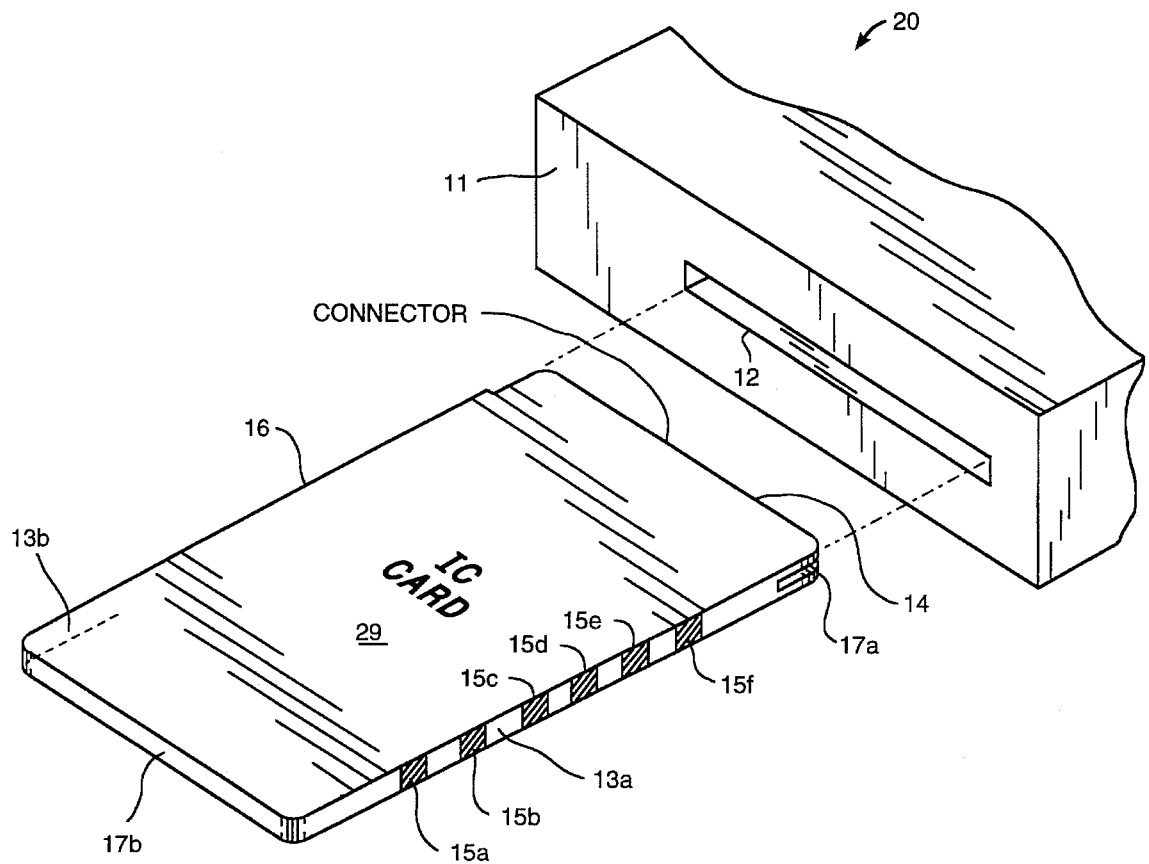
FIG_2

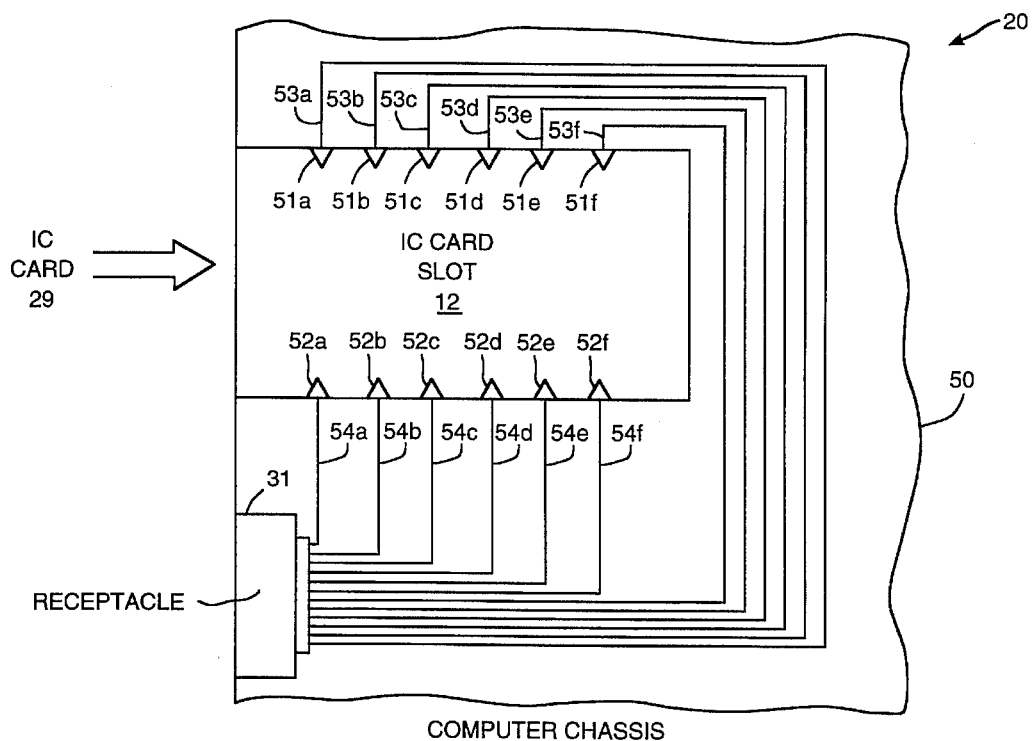
FIG_3
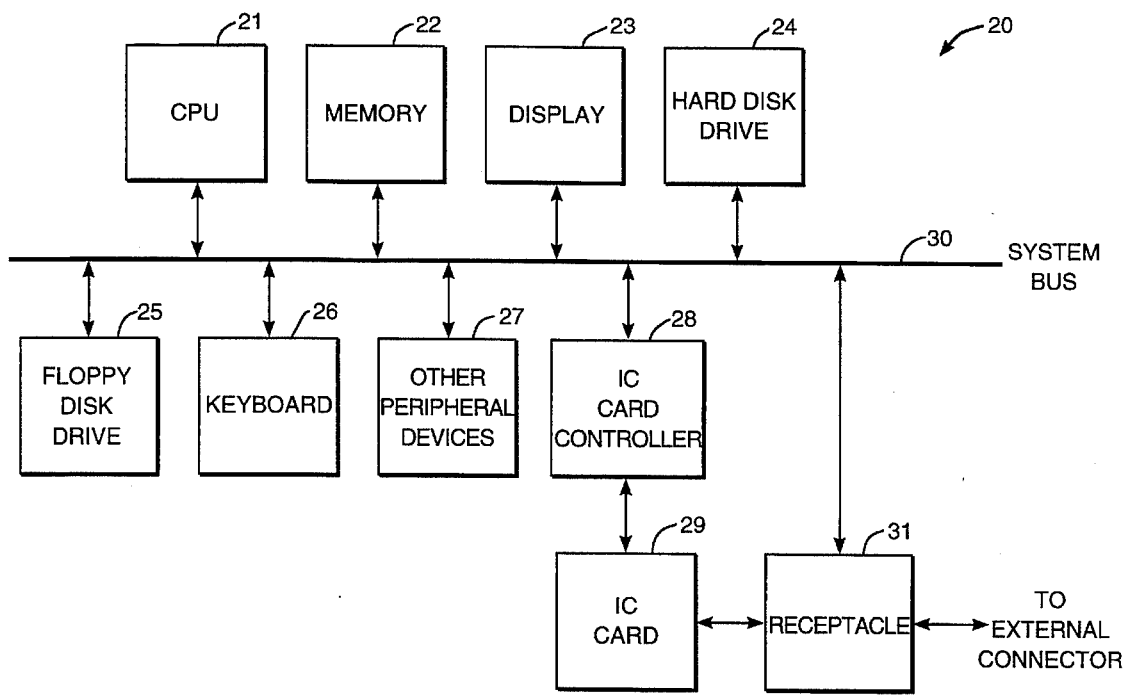
FIG_4

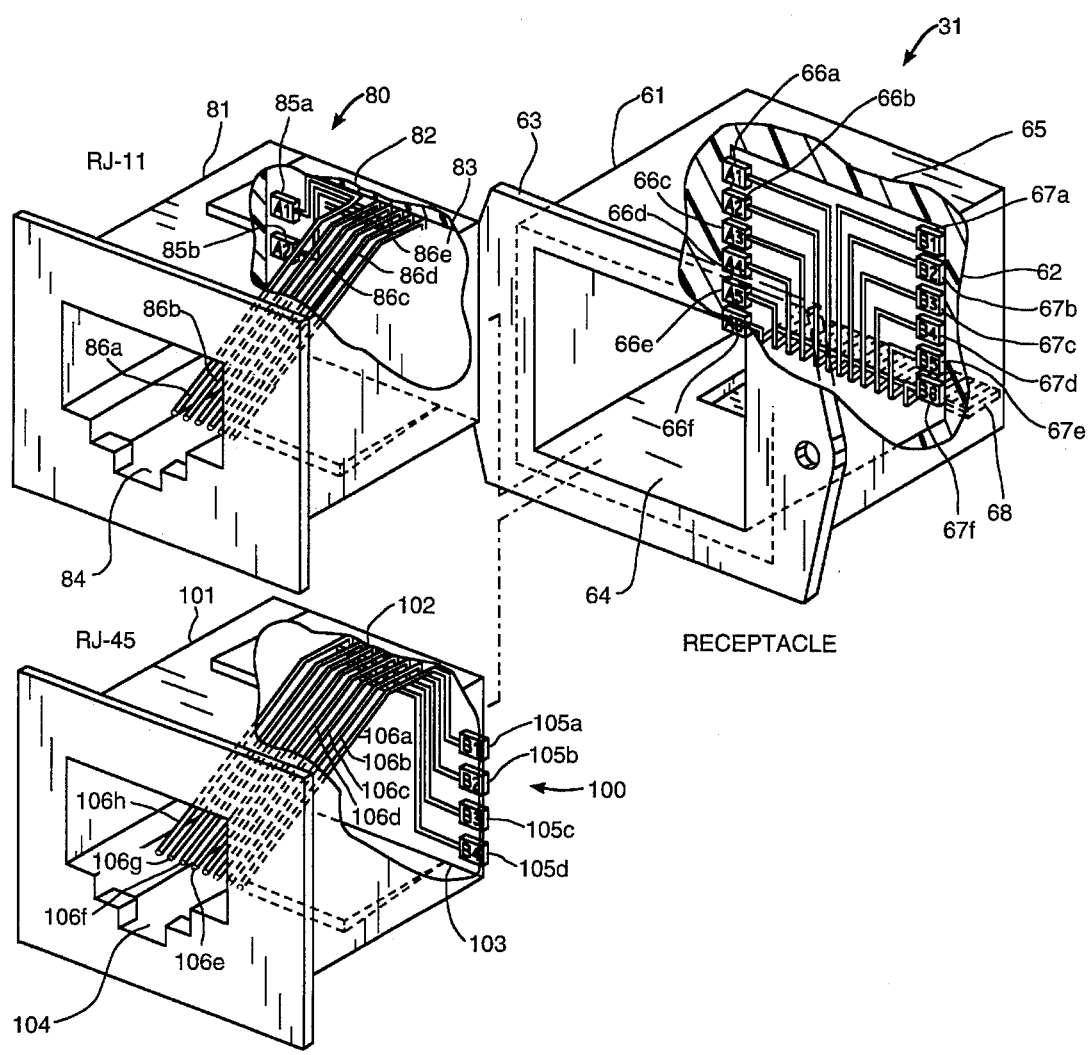
FIG_5
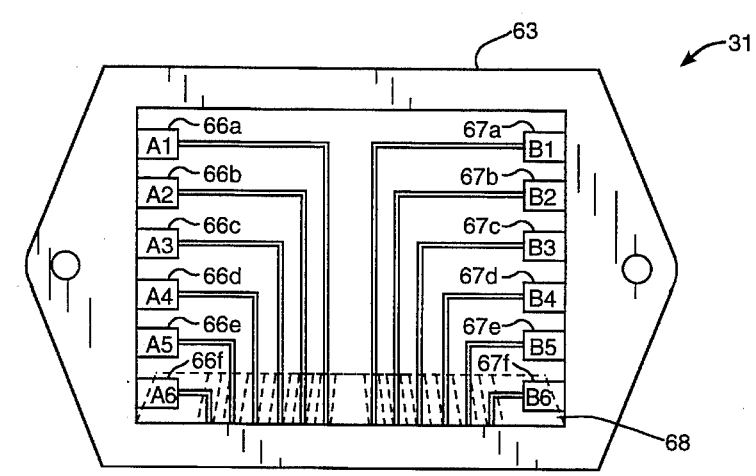
FIG_6

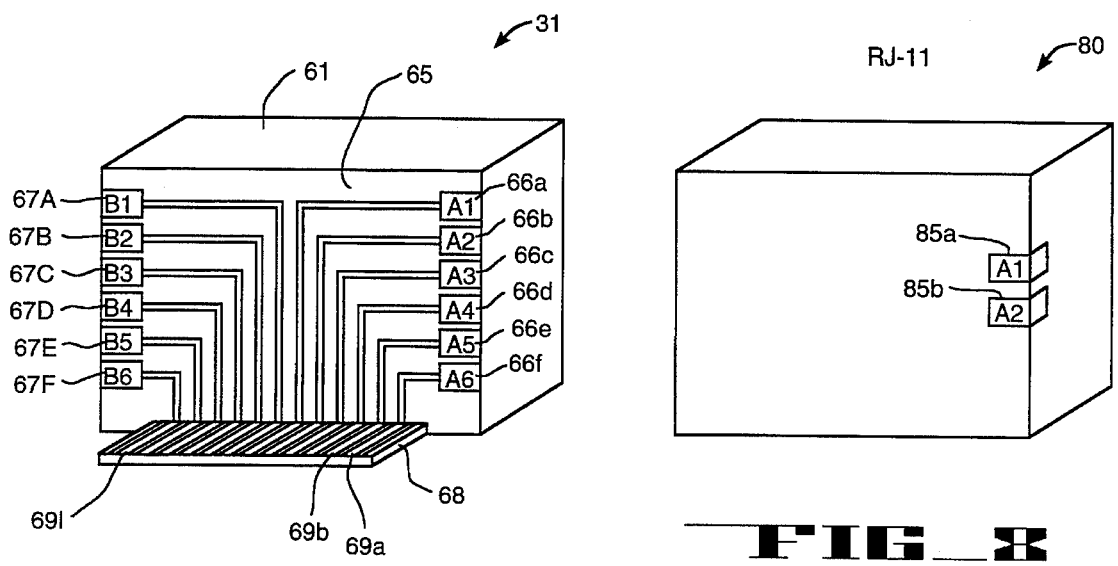
FIG_7
FIG_8
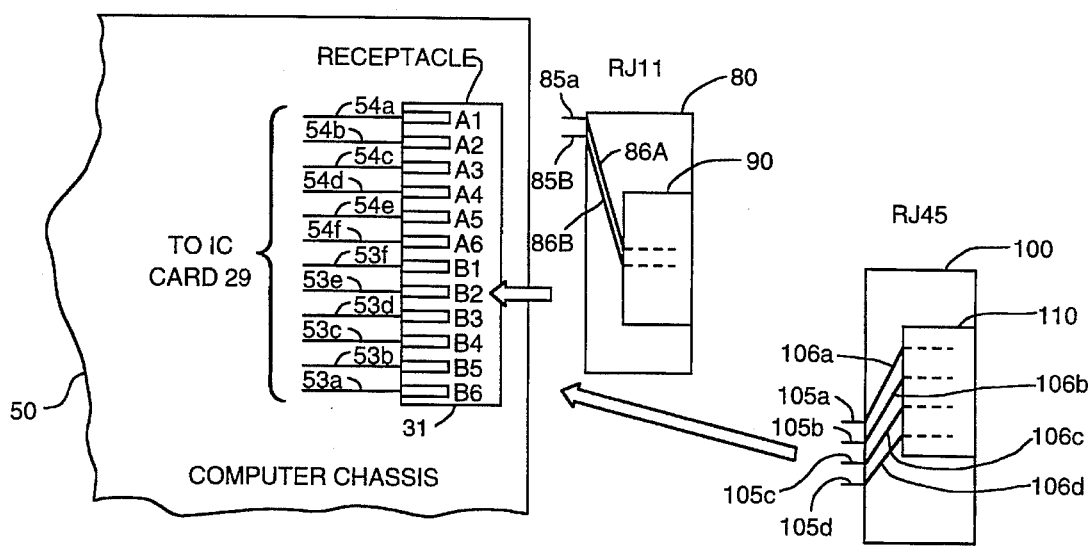
FIG_9

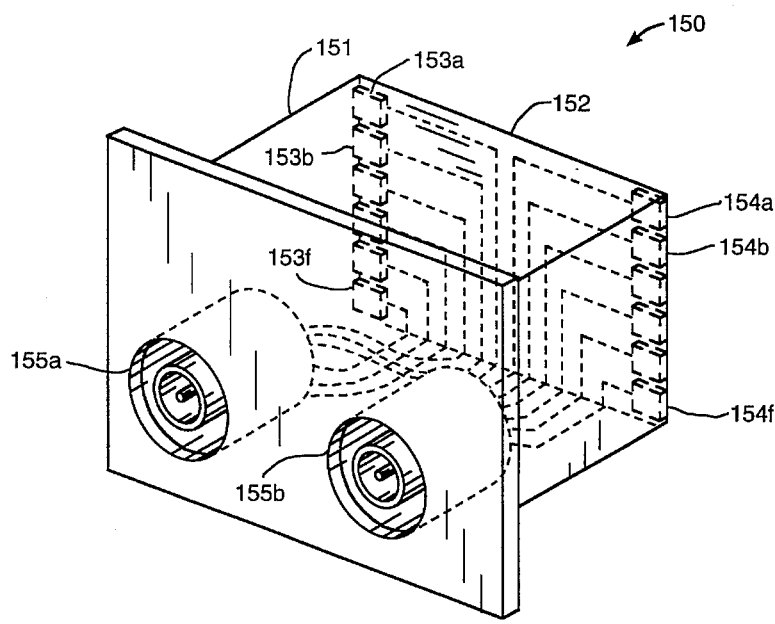
FIG_10
| JACK \ RECEPTACLE | A1 | A2 | A3 | A4 | A5 | (A6) | B1 | B2 | B3 | B4 | B5 | (B6) |
|---|---|---|---|---|---|---|---|---|---|---|---|---|
| MODEM (RJ11) | T | R | | | | | | | | | | |
| LAN (RJ45) | | | | | | | T1 | R1 | T2 | R2 | | |
| SOUND | | | | | | | M1 | M2 | SP1 | SP2 | | |
| CELLULAR PHONE | T | R | 5 | 6 | 7 | | 1 | 2 | 3 | 4 | 8 | |
FIG_11
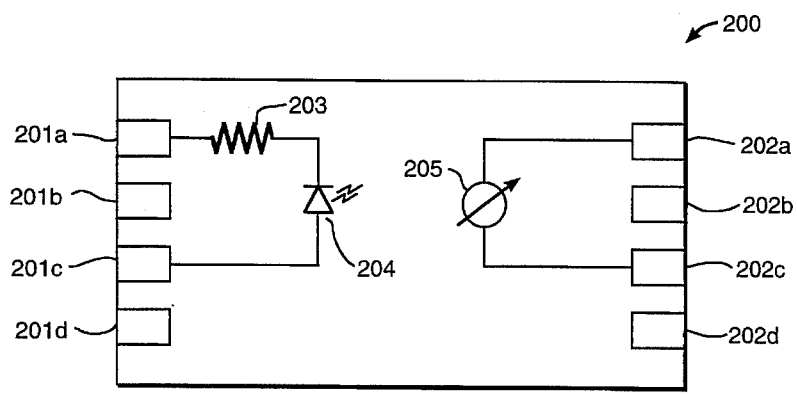
FIG_12

COMPUTER SYSTEM WITH AN INTERCONNECTION RECEPTACLE SUITABLE FOR DIFFERENT EXTERNAL CONNECTORS

FIELD OF THE INVENTION

The present invention pertains to the field of computer systems. More particularly, this invention relates to an interconnecting receptacle for a computer system that can be connected with different types of external connectors such that when the configuration of the computer system is changed that requires a different type of external connector, the interconnecting receptacle does not need to be replaced.

BACKGROUND OF THE INVENTION

A prior computer system typically includes peripheral input/output (I/O) circuits. These peripheral I/O circuits typically include MODEM ("modulation/demodulation") circuits, facsimile circuits, LAN ("local area network") circuits, etc. Each of the peripheral I/O circuits performs a specific I/O function for the prior computer system. A MODEM circuit, for example, allows the prior computer system to communicate with other remote computer systems via a public telephone network. When the prior computer system is to be connected with other local computer systems to form a network, the LAN circuit is used. Typically, the peripheral I/O circuits for a computer system are arranged on a printed circuit board within the computer system. A particular one of the I/O circuits is then used when the computer system is connected to the corresponding external hardware. For example, the MODEM circuit is triggered when the computer system is connected to the external public telephone system to transfer data to a remote computer system via the public telephone system.

However, such arrangement of the I/O circuits within the computer system bears disadvantages. One of the disadvantages is that the printed circuit board of the computer system needs to be relatively large to allow these I/O circuits to be mounted on the printed circuit board. This typically causes the size of the computer system to be accordingly large. Another disadvantage is that when the computer system does not use all the I/O circuits on the printed circuit board, it is typically a waste to mount those unused I/O circuits on the printed circuit board. For example, when the computer system is equipped with the MODEM circuit and the LAN circuit and only uses the MODEM circuit (i.e., the computer system is not connected to the local area network), the LAN circuit mounted is therefore a waste in the computer system. However, in order to allow the computer system to be able to connect with an external local area network, the LAN circuit needs to be mounted on the printed circuit board of the computer system.

One prior solution to this problem is to install only the I/O circuit that is currently needed in the computer system. When a different I/O circuit is required by the computer system, the existing I/O circuit installed can be taken out of the computer system and the required I/O circuit be installed. This is typically achieved in the form of electronic I/O cards. For example, a prior MODEM card includes the MODEM circuit and an electrical connector as part of a plastic package. Likewise, a prior LAN card includes a LAN circuit and an electrical connector within a plastic package. The size of an I/O card is typically smaller than a 3.5 inch floppy disk. The I/O card is inserted into the computer system via a slot of the computer system and is connected with the circuit of the computer system via the electrical connector. When a MODEM circuit is needed, the MODEM card is inserted into the computer system. When a LAN circuit is needed, the LAN card is inserted into the computer system. By doing so, the space required within the computer system is reduced. In addition, this also increases the flexibility of the computer system since all of the I/O cards need not be initially installed into the computer system.

One problem associated with the prior electronic I/O cards is that each type of the I/O card requires its own socket that connects the I/O card to the hardware external to the computer system to effectuate the I/O operation. For example, when a MODEM card is used, a telephone jack is required to connect the MODEM card to the external public telephone system. When a LAN card is employed, a LAN jack is required to connect the LAN card to the external LAN system. Since the jacks employed typically depend on the types of I/O cards inserted in the computer system, the user of the computer system is typically required to mount different types of jacks on the housing of the computer system to accommodate each of the distinct types of I/O cards that may be inserted into the computer system. This is typically burdensome and increases the overall cost to the computer system.

SUMMARY AND OBJECTS; OF THE INVENTION

One of the objects of the present invention is to provide a computer system with higher integration and more flexibility.

Another object of the present invention is to provide a computer system with an interconnecting receptacle for connecting the circuitry of the computer system with external circuitry, wherein the circuitry connected to the external circuitry via the receptacle can be changed by a user without requiring the receptacle to be changed.

Another object of the present invention is to provide an interconnecting receptacle for a computer system that is integrated with the housing of the computer system.

Another object of the present invention is to provide an interconnecting receptacle for electrically connecting an integrated circuit card inserted into a computer system to an external circuitry, wherein the receptacle is an integrated portion of the computer system and needs not be changed when a different type of integrated circuit card is inserted into the computer system.

An interconnecting receptacle for a computer system is described. The interconnecting receptacle includes a case mounted on a housing of the computer system and a plurality of metallic contacts located inside the case for electrically connecting circuitry of the computer system inside the housing to an external connector. The external connector can be one of (1) a first type of connector that includes a first number of electrical connectors and (2) a second type of connector that includes a second number of electrical connectors. When the external connector is the first type of connector and is inserted inside the case, a first set of the plurality of metallic contacts are used to connect to the first number of electrical connectors of the external connector. When the external connector is the second type of connector and is inserted inside the case, a second set of the plurality of metallic contacts are used to connect to the second number of electrical connectors of the external connector such that the interconnecting receptacle can be connected to both the first type and second type of connectors.

A computer system is described that includes circuitry coupled to a chassis inside a housing of the computer system and an integrated circuit card inserted onto the chassis through an opening on the housing for performing a predetermined electronic function in the computer system. The integrated circuit card is electrically connected with the circuitry on the chassis and to an external circuitry via an external connector. The integrated circuit card inserted can be one of (1) a first type of integrated circuit card that requires the external connector to be a first type of connector with a first number of electrical connectors and (2) a second type of integrated circuit card that requires the external connector to be a second type of external connector with a second number of electrical connectors. An interconnecting receptacle is used for electrically connecting the integrated circuit card to the external connector. The interconnecting receptacle further comprises a case mounted on the housing of the computer system and a plurality of metallic contacts located inside the case for electrically connecting the inserted integrated circuit card to the external connector. When the inserted integrated circuit card is the first type of integrated circuit card and the first type of external connector is inserted inside the case, a first set of the plurality of metallic contacts of the receptacle are used to connect to the first number of electrical connectors of the first type of external connector. When the inserted integrated circuit card is the second type of integrated circuit card and the second type of external connector is inserted inside the case, a second set of the plurality of metallic contacts of the receptacle are used to connect to the second number of electrical connectors of the second type of external connector such that the receptacle does not need to be changed when the integrated circuit card inserted onto the chassis is changed.

Other objects, features, and advantages of the present invention will be apparent from the accompanying drawings and from the detailed description that follows below.

BRIEF DESCRIPTION OF THE DRAWINGS

The present invention is illustrated by way of example and not limitation to the figures of the accompanying drawings, in which like references indicate similar elements and in which:

FIG. 1 is a perspective view of a portion of a computer system that includes an interconnecting receptacle that implements an embodiment of the present invention, wherein the receptacle can receive different types of external connectors;

FIG. 2 is a perspective view of another portion of the computer system of FIG. 1 and an integrated circuit card to be inserted into the computer system;

FIG. 3 shows a chassis of the computer system of FIGS. 1 and 2 and the connection between the integrated circuit card and the receptacle on the chassis;

FIG. 4 is a block diagram of the computer system of FIGS. 1 through 3;

FIG. 5 is a perspective view of the receptacle of FIGS. 1 and 3 through 4 and two different types of external connectors that can be connected with the receptacle;

FIG. 6 is a front plan view of the receptacle of FIG. 5;

FIG. 7 is a rear side perspective view of the receptacle of FIG. 5;

FIG. 8 is a rear side perspective view of one of the external connectors shown in FIG. 5;

FIG. 9 schematically illustrates the connection of the receptacle of FIG. 5 with the external connectors also shown in FIG. 5;

FIG. 10 illustrates a perspective view of another type of external connector that can also be connected with the receptacle of FIG. 5;

FIG. 11 is a table that shows the connection of the contacts of the receptacle of FIG. 5 with different types of external connectors;

FIG. 12 shows one type of active external connector that can also be connected to the receptacle of FIG. 5, wherein the active external connector includes active circuits inside the connector.

DETAILED DESCRIPTION

Referring to FIG. 1, a computer system 20 is partly shown that includes a housing 11 and an interconnecting receptacle 31 mounted on housing 11 of computer system 20. Interconnecting receptacle 31 implements an embodiment of the present invention. As will be described in more detail below in conjunction with FIG. 2 through 11, interconnecting receptacle 31 can be connected with different types of external connectors (i.e., jacks or plugs). By doing this, the external jack or plug that is connected to receptacle 31 can be changed without requiring receptacle 31 to be changed.

Computer system 20, in one embodiment, is a personal computer system. In a further embodiment, computer system 20 is a laptop computer or a notebook computer. In alternative embodiment, computer system 20 can be a portable computer, a workstation, a minicomputer, a mainframe computer, or any other type of computer. The configuration of computer system 20 will be described in more detail below, in conjunction with FIG. 4.

Receptacle 31 is used in computer system 20 to connect an integrated circuit ("IC") card (shown in FIG. 2) inserted inside computer system 20 to circuitry external to computer system 20 via an external jack or plug (shown in FIG. 5). The external jack is inserted into receptacle 31. The external jack is changed from one type to another when the IC card inserted inside computer system 20 is changed from one type to another. In accordance with one embodiment of the present invention, receptacle 31, however, is not changed despite the change of the external jack. Receptacle 31 therefore is a universal receptacle that can fit for different types of external jacks. The structure and function of receptacle 31 will be described in more detail below, in conjunction with FIGS. 3 through 11.

FIG. 1 only shows one receptacle 31 mounted on housing 11 of computer system. In practice, more than one receptacle identical to receptacle 31 may be mounted on housing 11 of computer system 20. For example, computer system 20 may have two receptacles that are identical to receptacle 31 mounted on housing 11 adjacent to each other. As a further example, computer system 20 may include more than two receptacles that are identical to receptacle 31. Receptacle 31 can be connected or partially connected to the circuits inside computer system 20. For example, receptacle 31 can be connected to the power supply of the computer system for providing the power supply voltage to the circuitry external to computer system 20.

FIG. 2 is a perspective view of an IC card 29. FIG. 2 also shows another portion of computer system 20 of FIG. 1. As can be seen from FIG. 2, computer system 20 includes a slot or opening 12 on housing 11. IC card 29 is inserted into slot 12 of computer system 20. Once inserted into slot 12, IC card 29 is then connected to the circuits of computer system 20 residing inside housing 11. In addition, IC card 29 is also connected to receptacle 31 (shown in FIG. 1) which is mounted on housing 11 of computer system 20. This will be described in more detail below, in conjunction with FIGS. 3 through 11.

Referring again to FIG. 2, IC card 29 includes a front end 17a and a back end 17b. IC card 29 has a connector 14 located at front end 17a of card 29. Connector 14 of IC card 29 is used to connect IC card 29 to the circuits of computer system 20 inside housing 11 when IC card 29 is inserted into slot 12. Connector 14 has multiple pin sockets for coupling card 29 electrically to computer system 20 when card 29 is inserted into slot 12 of computer system 20. Connector 14 constitutes the standard interface of card 29. In one embodiment, connector 14 includes sixty-eight pin sockets, each for mating with one of the plurality of pins located inside housing 11 of computer system 20.

IC card 29 may also include a connector (not shown) at back end 17b. The connector at back end 17b can be connected to an external connector for transferring signals to external hardware external to computer system 20.

IC card 29 includes a plastic package 16 that is smaller than a 3.5 inch floppy disk. In one embodiment, IC card 29 has a thickness of 3 mm, a length of 85.60 mm, and a width of 10 mm. In alternative embodiments, the dimensions of IC card 29 can vary. For example, IC card 29 can have a thickness of 3 mm at the outer edges and a thickness of 5 mm in the inner portion of the card. In addition, card 29 may include an extended portion that remains outside the computer when card 29 is inserted into slot 12.

Inside plastic package 16 of IC card 29 there is a circuit board assembly (not shown) that includes a number of integrated circuits (not shown) mounted on a printed circuit board (not shown). The integrated circuits inside plastic package 16 of IC card 29 perform a designated function for computer system 20. For example, IC card 29 can be a LAN card. In this case, the integrated circuits inside plastic package 16 provide the protocol and handshaking necessary to achieve the LAN connection. In anther embodiment, IC card 29 can be a MODEM card. In this case, the integrated circuits inside plastic package 16 of card 29 provide the necessary modulation and demodulation function for computer system 20 to communicate with a remote computer system via a public telephone system. Alternatively, IC card 29 can be other types of I/O cards that provide a variety of input/output functions for computer system 20. For example, IC card 29 can be a communication card that provides radio frequency or infrared communications for computer system 20.

IC card 29 can perform one designated I/O function or multiple designated I/O functions. In one embodiment, IC card performs only one designated I/O function and if computer system 20 requires a different I/O function, IC card 29 is replaced with another IC card. In another embodiment, IC card 29 can perform multiple I/O functions. In this case, IC card 29 may not need to be changed when computer system 20 requires a different I/O function.

IC card 29 can also be referred to as PC (i.e., personal computer) card. This is the case when IC card 29 is manufactured in accordance with an international standard introduced by the Personal Computer Memory Card International Association ("PCMCIA"). IC cards adhering to the PCMCIA standard are often referred to as PC cards.

IC card 29 also has opposite sides 13a and 13b. IC card 29 includes a number of sideswipe contacts on each of sides 13a through 13b. FIG. 2 only shows sideswipe contacts 15a through 15f on side 13a. The sideswipe contacts of IC card 29 provide additional connection for the card for transferring signals by means other than the standard interface (i.e., connector 14). Although only six sideswipe contacts are shown in FIG. 2 on side 13a, each of sides 13a–13b of IC card 29 may contain more or fewer than six sideswipe contacts.

The total number of sideswipe contacts of card 29 may depend on the I/O function that IC card 29 performs. For example, when IC card 29 is a MODEM card, card 29 has two sideswipe contacts on only one of sides 13a–13b. When IC card 29 is a LAN card, card 29 has four sideswipe contacts on only one of sides 13a–13b. Alternatively, IC card 29 may have six sideswipe contacts on each of sides 13a–13b despite the designated I/O function. Depending on the designated I/O function IC card 29 performs, card 29 then uses some of the sideswipe contacts on sides 13a–13b to transfer signals to and from receptacle 31 (FIG. 1). For example, when card 29 is a MODEM card, card 29 uses two sideswipe contacts 15a–15b on side 13a to transfer signals to and from receptacle 31. When card 29 is a LAN card, card 29 uses four of the sideswipe contacts on side 13b for transferring signals.

As is known, different I/O cards require different types of external connectors. For example, a MODEM card requires an RJ 11 jack and a twisted pair Ethernet ("TPE") LAN card requires an RJ 45 jack. An external connector is connected to its respective I/O card via receptacle 31 of FIG. 1. For example, when IC card 29 is a LAN card, an RJ 45 jack (shown in FIG. 5) is used to connect card 29 to the external hardware of the local area network via receptacle 31. When IC card 29 is a MODEM card, an RJ 11 jack (shown in FIG. 5) is employed to connect card 29 to the external public telephone system via receptacle 31. As is known, the RJ 45 jack and the RJ 11 jack are two different types of jacks that include different numbers of connectors. In accordance with one embodiment of the present invention. Receptacle 31, however, remains unchanged when the external connector connected to receptacle 31 is changed from, for example, the RJ 45 jack to the RJ 11 jack. Receptacle 31 will be described in more detail below, in conjunction with FIGS. 3–11.

The size of each of sideswipe contacts 15a–15f and that of each of the sideswipe contacts on side 13b is dependent on the size of card 29 and on the contact scheme employed. In one embodiment, the sideswipe contacts may be flush along each of sides 13a–13b. In a further embodiment, each of the sideswipe contacts is 5 mm long and 3 mm wide.

The sideswipe contacts of card 29 is comprised of a highly conductive material such as gold plated copper. The sideswipe contacts may be recessed along sides 13a–13b.

The sideswipe contacts on sides 13a–13b of card 29 allow card 29 to route signals to receptacle 31 (FIG. 1) and vice versa. FIG. 5 illustrates the perspective view of receptacle 31, which will be described in more detail below. IC card 29, when inserted into slot 12 of computer system 20, has each of its sideswipe contacts contacting one of a number of sideswipe contact points arranged in slot 12 of computer system 20. Each of the sideswipe contact points is then connected to receptacle 31 (FIG. 1), thus allowing IC card 29 to be electrically connected to receptacle 31 by means other than connector 14. The sideswipe contact points in slots 12 and the arrangement of connecting IC card 29 to receptacle 31 via the sideswipe contacts on card 29 and the sideswipe contact points is described below, in conjunction with FIG. 3.

Referring to FIG. 3, a chassis 50 of computer system 20 is partly shown. FIG. 3 also shown slot 12 and receptacle 31 on chassis 50. FIG. 3 does not shown other circuits of computer system 20 on chassis 50 in order not to unnecessarily obscure the preset invention. In practice, many integrated circuits of computer system 20 are mounted on chassis 50.

As shown in FIG. 3, chassis 50 includes a number of sideswipe contact points 51 a through 51f and 52a through 52f that are arranged along two sides of slot 12. Each of sideswipe contact points 51a–51f and 52a–52f is used to contact one of the sideswipe contacts of card 29 when card 29 is inserted into slot 12. As can be seen from FIG. 3, sideswipe contact points 51a–51f and 52a–52f are evenly arranged along the two sides of slot 12. The number of contact points 51a–51f and 52a–52f may correspond to the number of the sideswipe contacts of IC card 29 or may be more than that of the sideswipe contacts.

Each of contact points 51a–51f is connected to receptacle 31 via a wire on chassis 50. For example, contact point 51 a is connected to receptacle 31 via a wire 53a and contact point 52f is connected to receptacle 31 via a wire 54f. In one embodiment, each of contact points 51a–51f and 52a–52f comprises an angled piece of metal. Each of contact points 51a–51f and 52a–52f is flexible such that upon insertion of card 29 into slot 12, each of contact points 51a–51f and 52a–52f flattens to allow the insertion of card 29 and to firmly contact its respective one of the sideswipe contacts of card 29 once card 29 has been inserted into slot 12. In another embodiment, each of contact points 51a–51f and 52a–52f is a spring loaded contact point. In alternative embodiments, each of contact points 51a–51f and 52a–52f can be any other type of contact point.

As described above, in connection with FIG. 1, receptacle 31 may also be connected to the circuits mounted on chassis 50 of computer system 20. In one embodiment and as shown in FIG. 3, receptacle 31 is connected to IC card 29 of FIG. 2 via contact points 51a–51f and 52a–52f. In alternative embodiments, receptacle 31 can have one or more than one of its contacts connected to the circuits mounted on chassis 50 of computer system 20. For example, in addition to the connection to IC card 29 of FIG. 2 via contact points 51a–51f and 52a–52f, receptacle 31 can be additionally connected to the power supply of computer system 20 on chassis 50 for providing the power supply voltage to the external circuitry via the external connector that is connected to receptacle 31. In addition, receptacle 31 can also be entirely connected to the circuits of computer system 20 that are mounted on chassis 50.

Referring to FIGS. 2 and 3, each of sideswipe contacts 15a–15f along side 13a of card 29 contacts the respective one of contact points 52a–52f within slot 12 and each of the sideswipe contacts along side 13b (not shown) of card 29 contacts the respective one of contact points 51a–51f within slot 12 when card 29 is inserted into slot 12. As described above, the total number and the position of the sideswipe contacts used in card 29 for signal transfer may not match that of sideswipe contact points 51a–51f and 52a–52f. In this case, only some of sideswipe contact points 51a–51f. In this case, only some of sideswipe contact points 51a–51f and 52a–52f electrically connect IC card 29 to receptacle 31. For example, when IC card 29 is a MODEM card 29, card 29 may only include sideswipe contacts 15a and 15b or uses contacts 15a and 15b for signal transfer with receptacle 31. When IC card 29 is a LAN card, card 29 may only include four sideswipe contacts on side 13b that correspond to contact points 51a–51f or uses the four contacts that correspond to contact points 51c–51f for signal transfer. As will be described in more detail below in connection with FIGS. 5 through 11, receptacle 31 includes a number of metallic contacts (shown in FIG. 5), each being connected to one of contact points 51a–51f and 52a–52f via one of wires 53a–53f and 54a–54f. Therefore, despite the I/O function that IC card 29 is designated, receptacle 31 always has a number of its metallic contacts connected with IC card 29. Which one of the metallic contacts of receptacle 31 is connected to its respective one of the sideswipe contacts of card 29 depends on the I/O function to which IC card 29 is designated. Therefore, receptacle 31 can be connected to different types of I/O cards that implement different I/O functions.

As described above, computer system 20 may include two or more than two receptacles that are identical to receptacle 31. For example, an additional receptacle identical to receptacle 31 may be mounted adjacent to receptacle 31. In this case, some of contact points 51a–51f and 52a–52f may be connected to the additional receptacle. For example, contact points 52a and 52b may be connected to the additional receptacle.

Referring to FIG. 4, computer system 20 of FIGS. 1–3 is shown in block diagram form that includes a central processing unit ("CPU") 21. For one embodiment, CPU 21 includes a microprocessor, a co-processor, a cache, and a cache controller for handling access to the cache by the microprocessor.

CPU 21 is coupled to a system bus 30 of computer system 20. System bus 30 is used in computer system 20 as the backplane bus for transfer of data among various components of computer system 20.

Computer system 20 includes memory 22 accessed by CPU 21 via system bus 30. Memory 22 stores programs and data that are needed for the operation of computer system 20. Memory 22 may include random access memories ("RAMs"), read only memories ("ROMs"), EPROMs, flash EPROMs, and other types of memories.

Computer system 20 also includes a floppy disk drive 25, a keyboard 26, a display 23, and a hard disk drive 24 coupled to system bus 30. Computer system 20 also includes other peripheral devices 27 that are connected to system bus 30.

Computer system 20 further includes an integrated circuit ("IC") card controller 28. IC card controller 28 is coupled to bus 30. IC card controller 28 is also connected to IC card 29. IC card 29 is connected to IC card controller 28 via connector 14 (shown in FIG. 2) when IC card 29 is inserted into slot 12 of computer system 20 (see FIGS. 2–3). IC card 29, when inserted in slot 12 of computer system 20, is also connected to receptacle 31 (see FIGS. 3–4). Receptacle 31 is then connected to an external connector that can be different types of jacks or plugs, according to one embodiment of the present invention.

Referring again to FIG. 4, IC card controller 28 is used in computer 20 to control data and signal transfer between IC card 29 and the remaining components of computer system 20. In fact, IC card controller 28 acts as an interface between IC card 29 and the remaining components of computer system 20.

Receptacle 31 can also be directly connected to bus 30 for communicating with components 21 through 27 via system bus 30. System bus 30 may include power supply transmission lines that supply the power to each of components 21 through 28 via bus 30. In this situation, receptacle 31, when coupled to bus 30, may provide the power supply of computer system 20 to the external circuitry.

FIG. 5 illustrates the perspective view of receptacle 31 shown in FIGS. 1 and 3–4 that implements an embodiment of the present invention. FIG. 5 also shows the perspective view of the two different external connectors (i.e., an RJ 11 jack 80 and an RJ 45 jack 100) that are to be connected to receptacle 31. FIG. 5 only shows two of the different external connectors that can be connected to receptacle 31. In practice, many other standard external connectors can be connected to receptacle 31. For example, the external connector can be an infra-red antenna jack or a radio frequency antenna jack. As a further example, the external connector can be a cellular phone antenna jack. FIG. 10 illustrates a co-axial jack 150 that can also be connected to receptacle 31. Receptacle 31 is manufactured to be connected with different external connectors, according to the present invention.

As a still further example, the external connector can be an active jack that includes active circuitry inside the jack. For example, the external connector can be an infrared jack with photo detecting circuit inside the jack. FIG. 12 shows an example of such active jack 200. It is to be noted that the circuit formed by elements 203 through 205 in FIG. 12 only serves the illustration purposes and other circuit configurations can also be used in an active jack. Active connectors or jacks with circuits mounted inside are known in the art.

Referring to FIG. 5, receptacle 31 is shown that includes a case 61 with an opening 64 and a rear wall 65. A front panel 63 is attached to case 61 at opening 64. Case 61 is in a rectangular shape. Case 61 can be made of plastic or ceramic material. In addition, case 61 can be made of other insulative materials. A number of metallic contacts 66a–66f and 67a–67f are arranged on rear wall 65. The cutaway part 62 of receptacle 31 in FIG. 5 illustrates the arrangement of metallic contacts 66a–66f and 67a–67f. In addition, FIGS. 6 and 7 also show the arrangement of metallic contacts 66a–66f and 67a–67f on rear wall 65. FIG. 6 is the front view of receptacle 31 of FIG. 5. FIG. 7 is the near side perspective view of receptacle 31 of FIG. 5.

FIGS. 5–7 only illustrate metallic contacts 66a–66f and 67a–67f on rear wall 65. However, rear wall 65 may include more or fewer metallic contacts than metallic contacts 66a–66f and 67a–67f. For example, rear wall 65 may include eight or ten metallic contacts along each side of rear wall 65. It is only required that the number of metallic contacts on rear wall 65 is more than or equal to the number of contacts on the external connector that is connected to receptacle 31.

Referring to FIGS. 5–7, metallic contacts 66a–66f are arranged along one side of the inner surface of rear wall 65 and metallic contacts 67a–67f are arranged along the other side of the inner surface of rear wall 65. In one embodiment, metallic contacts 66a–66f and 67a–67f are deposited on the inner surface of rear wall 65. In another embodiment, metallic contacts 66a–66f and 67a–67f form part of rear wall 65 such that metallic contacts 66a–66f and 67a–67f appear on both surfaces of rear wall 65. As can be seen from FIGS. 5–7, receptacle 31 also includes a rear board 68 attached to rear wall 65 of case 61 of receptacle 31. Rear board 68 includes a number of wires 69a–69l, each being connected to one of metallic contacts 66a–66f and 67a–67f. For example, wire 69a is connected to metallic contact 66f and wire 69l is connected to metallic contact 67f. Wires 69a–69l on board 68 are then connected to contact points 51a–51f and 52a–52f via wires 53a–53f and 54a–54f, respectively (see FIG. 3).

Referring to FIG. 5, an RJ 11 jack 80 and an RJ 45 jack 100 are also shown. Each of RJ 11 jack 80 and RJ 45 jack 100 can be inserted into case 61 of receptacle 31. The cutaway part 82 of jack 80 illustrates the internal structure of jack 80 and the cutaway part 102 of jack 100 illustrates the internal structure of jack 100. FIG. 8 illustrates the rear side perspective view of jack 80 of FIG. 5.

As can be seen from FIG. 5 and 8, jack 80 includes a case 81, the outer contour of which mates with the inner chamber of case 61 of receptacle 31 when jack 80 is inserted in to receptacle 31. Case 81 also includes a rear wall 83 and front opening 84. As can be seen from the cutaway part 82 of jack 80 in FIG. 5 and from FIG. 8, jack 80 includes metallic contacts 85a–85b arranged on the outer surface of rear wall 83. When jack 80 is inserted into receptacle 31, each of contacts 85a and 85b contacts one of contacts 66a–66b that are arranged on the inner surface of rear wall 65 of receptacle 31. Each of contacts 85a–85b is connected to one of conductors 86a–86b. An external plug 90 (shown in FIG. 9) is plugged into jack 80 via opening 84 and connected to conductors 86a–86b.

As can be seen from FIG. 8, contacts 85a–85b extend to the side wall of case 81. Alternatively, contacts 85a–85b do not extend to the side wall of case 81.

Referring back to FIG. 5, jack 100 includes a case 100, the outer contour of which also mates with the inner chamber of case 61 of receptacle 31. Case 101 also includes a rear wall 103 and a front opening 104. An external plug 110 (shown in FIG. 9) for jack 100 can be plugged into case 101 via opening 104.

As can be seen from the cutaway part 102, case 101 includes metallic contact 105a–105d arranged on the outer surface of rear wall 103 of jack 100. Metallic contacts 105a–105d are arranged on the outer surface of rear wall 103 such that when jack 100 is inserted into receptacle 31, each of contacts 105a–105d can be in contact with one of metallic contacts 67a–67d on rear wall 65 of receptacle 31. Each of contacts 105a–105d is connected to one of a number of conducts 106a–106d. These conducts are then in contact with external plug 110 (shown in FIG. 9) inserted in jack 100 via opening 104.

FIG. 9 schematically illustrates the arrangement, in accordance with an embodiment of the present invention, in which receptacle 31 is able to be connected to different external connectors. FIG. 9 illustrates how receptacle 31 is connected to RJ 11 jack 80 of FIG. 5 and to RJ 45 jack 100 of FIG. 5.

FIG. 10 illustrates a co-axial jack 150 that can also be connected with receptacle 31 of FIG. 5. As can be seen from FIG. 10, jack 150 includes a case 151 having a rear wall 152. A number of metallic contacts 153a–153f and 154a–154f are arranged on the outer surface of rear wall 152 for contacting its respective contacts 66a–66f and 67a–67f of receptacle 31 (FIGS. 5–7) when jack 150 is inserted into receptacle 31. Jack 150 also includes two co-axial sockets 155a–155b, each for receiving a co-axial plug.

FIG. 11 illustrates when one of metallic contacts 66a–66f and 67a–67f of receptacle 31 of FIGS. 5–7 is in contact with a corresponding metallic contact of an external jack. As can be seen from the table in FIG. 11, when an RJ 45 jack is connected with receptacle 31 (FIGS. 5–7), contacts 67a–67d (i.e., B1–B4) of receptacle 31 are in contact with their corresponding contacts of the external RJ 45 jack. When a cellular phone antenna jack is connected with receptacle 31, contacts 66a–66e and 67a–67e of receptacle 31 are in contact with their corresponding contacts of the external cellular phone antenna jack.

In the foregoing specification, the invention has been described with reference to specific embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An interconnecting receptacle for a computer system, comprising:

(A) a case mounted on a housing of the computer system for receiving an external connector, wherein the case is not detachable from the housing and is fixed on the housing;

(B) a plurality of metallic contacts located inside the case for electrically connecting circuitry of the computer system inside the housing to the external connector, wherein the external connector can be one of (1) a first type of connector that includes a first number of electrical connectors and (2) a second type of connector that includes a second number of electrical connectors, wherein when the external connector is the first type of connector and is inserted inside the case, a first set of the plurality of metallic contacts are used to connect to the first number of electrical connectors of the external connector, wherein when the external connector is the second type of connector and is inserted inside the case, a second set of the plurality of metallic contacts are used to connect to the second number of electrical connectors of the external connector such that the interconnecting receptacle can be connected to both the first and second types of connectors.

2. The interconnecting receptacle of claim 1, wherein the number of the plurality of metallic contacts is greater than or equal to that of the first number of electrical connectors and is also greater than or equal to that of the second number of electrical connectors.

3. The interconnecting receptacle of claim 1, wherein the case further comprises a back surface, wherein the plurality of metallic contacts are mounted on the back surface of the case such that (1) when the first type of connector is inserted inside the case, each of the first set of the plurality of metallic contacts is in contact with one of the first number of electrical connectors and (2) when the second type of connector is inserted inside the case, each of the second set of the plurality of metallic contacts is in contact with one of the second number of electrical connectors.

4. The interconnecting receptacle of claim 1, wherein the case further comprises a first side surface and a second side surface, wherein the plurality of metallic contacts are evenly located on the first and second side surfaces of the case such that (1) when the first type of connector is inserted inside the case, each of the first set of the plurality of metallic contacts is in contact with one of the first number of electrical connectors and (2) when the second type of connector is inserted inside the case, each of the second set of the plurality of metallic contacts is in contact with one of the second number of electrical connectors.

5. The interconnecting receptacle of claim 1, wherein the external connector can be one of a plurality types of connectors, including the first and second types of connectors.

6. The interconnecting receptacle of claim 5, wherein the first type of connector is a telephone jack and the second type of connector is a local area network jack.

7. The interconnecting receptacle of claim 5, wherein the plurality types of connectors further comprise (1) a third type of connector which includes a coaxial socket and (2) a fourth type of connector which is a cellular phone antenna jack.

8. A computer system comprising:

(A) circuitry coupled to a chassis inside a housing;

(B) an integrated circuit card inserted onto the chassis through an opening on the housing for performing a predetermined electronic function in the computer system, wherein the integrated circuit card is electrically connected with the circuitry on the chassis and to an external circuitry via an external connector, wherein the integrated circuit card inserted can be one of (1) a first type of integrated circuit card that requires the external connector to be a first type of external connector with a first number of electrical connectors and (2) a second type of integrated circuit card that requires the external connector to be a second type of external connector with a second number of electrical connectors;

(C) an interconnecting receptacle for electrically connecting the integrated circuit card to the external connector, wherein the interconnecting receptacle further comprises (i) a case mounted on the housing of the computer system for receiving the external connector;

(ii) a plurality of metallic contacts located inside the case for electrically connecting the integrated circuit card inserted to the external connector, wherein when the integrated circuit card inserted onto the chassis is the first type of integrated circuit card and the first type of external connector is inserted inside the case, a first set of the plurality of metallic contacts are used to connect to the first number of electrical connectors of the first type of external connector, wherein when the integrated circuit card inserted onto the chassis is the second type of integrated circuit card and the second type of external connector is inserted inside the case, a second set of the plurality of metallic contacts are used to connect to the second number of electrical connectors of the second type of external connector such that the interconnecting receptacle does not need to be changed when the integrated circuit card inserted onto the chassis is changed.

9. The computer system of claim 8, wherein the number of the plurality of metallic contacts is greater than or equal to that of the first number of electrical connectors and is also greater than or equal to that of the second number of electrical connectors.

10. The computer system of claim 8, wherein the case further comprises a back surface, wherein the plurality of metallic contacts are mounted on the back surface of the case such that (1) when the first type of connector is inserted inside the case, each of the first set of the plurality of metallic contacts is in contact with one of the first number of electrical connectors and (2) when the second type of connector is inserted inside the case, each of the second set of the plurality of metallic contacts is in contact with one of the second number of electrical connectors.

11. The computer system of claim 8, wherein the case further comprises a first side surface and a second side surface, wherein the plurality of metallic contacts are evenly mounted on the first and second side surfaces of the case such that (1) when the first type of connector is inserted inside the case, each of the first set of the plurality of metallic contacts is in contact with one of the first number of electrical connectors and (2) when the second type of connector is inserted inside the case, each of the second set of the plurality of metallic contacts is in contact with one of the second number of electrical connectors.

12. The computer system of claim 8, wherein when the integrated circuit card is the first type of integrated circuit card, the integrated circuit card includes a first number of electrical contacts, each being coupled to one of the first set of the plurality of metallic contacts when the integrated circuit card is inserted onto the chassis, wherein when the integrated circuit card is the second type of integrated circuit card, the integrated circuit card includes a second number of electrical contacts, each being coupled to one of the second set of the plurality of metallic contacts when the integrated circuit card is inserted onto the chassis.

13. The computer system of claim 9, wherein both the first and second numbers of electrical contacts are located on side surfaces of the case of the integrated circuit card.

14. The computer system of claim 8, wherein integrated circuit card can be one of a plurality types of integrated circuit input/output cards, including the first and second types of integrated circuit cards, wherein the external connector can be one of a plurality types of connectors, including the first and second types of connectors.

15. The computer system of claim 11, wherein the first type of integrated circuit card is a facsimile/modulation-demodulation card and the second type of integrated circuit card is a local area network card, wherein the first type of connector is a telephone jack and the second type of connector is a local area network jack.

16. The computer system of claim 11, wherein the plurality types of integrated circuit input/output cards further comprise (1) a third type of integrated circuit card which is a sound card and (2) a fourth type of integrated circuit card which is a cellular phone antenna card, wherein the plurality types of connectors further comprise (3) a third type of connector which includes a coaxial socket and (4) a fourth type of connector which is a cellular phone antenna jack.

* * * * *

UNITED STATES PATENT AND TRADEMARK OFFICE
CERTIFICATE OF CORRECTION

PATENT NO.   : 5,501,608
DATED        : March 26, 1996
INVENTOR(S)  : Scheer et al.

It is certified that error appears in the above-identified patent and that said Letters Patent is hereby corrected as shown below:

On the cover page, in the second line of the title in section [54], delete "INTERCONNECTION" and substitute --INTERCONNECTING--.

In column 1, in the title in line 2, delete "INTERCONNECTION" and substitute --INTERCONNECTING--.

In column 1, at line 49, delete "I_AN" and substitute --LAN--.

In column 13, at line 10, delete "claim 9" and substitute --claim 12--.

In column 14, at line 1, delete "claim 11" and substitute --claim 14--.

In column 14, at line 8, delete "claim 11" and substitute --claim 14--.

Signed and Sealed this

Fifth Day of November, 1996

Attest:

BRUCE LEHMAN

*Attesting Officer*    *Commissioner of Patents and Trademarks*